(12) United States Patent
Kim et al.

(10) Patent No.: US 8,592,265 B2
(45) Date of Patent: Nov. 26, 2013

(54) METHOD FOR MANUFACTURING SEMICONDUCTOR DEVICE HAVING A METAL GATE ELECTRODE

(75) Inventors: Dong-Kwon Kim, Yongin-si (KR);
Young-Ju Park, Geumcheon-gu (KR);
Dong-Hyuk Yeam, Gwangsan-gu (KR);
Yoo-Jung Lee, Yongin-si (KR);
Myeong-Cheol Kim, Suwon-si (KR);
Do-Hyoung Kim, Hwaseong-si (KR);
Heung-Sik Park, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 91 days.

(21) Appl. No.: 13/242,382

(22) Filed: Sep. 23, 2011

(65) Prior Publication Data
US 2012/0088359 A1 Apr. 12, 2012

(30) Foreign Application Priority Data
Oct. 12, 2010 (KR) ........................ 10-2010-0099393

(51) Int. Cl.
*H01L 21/338* (2006.01)
(52) U.S. Cl.
USPC ................ 438/184; 438/183; 257/E21.444
(58) Field of Classification Search
USPC .................................................. 438/183, 184
See application file for complete search history.

(56) References Cited

U.S. PATENT DOCUMENTS

| | | | | |
|---|---|---|---|---|
| 5,420,071 A | * | 5/1995 | Burke | 438/649 |
| 5,953,612 A | * | 9/1999 | Lin et al. | 438/299 |
| 6,248,633 B1 | * | 6/2001 | Ogura et al. | 438/267 |
| 6,777,761 B2 | | 8/2004 | Clevenger et al. | |
| 2008/0265322 A1 | * | 10/2008 | Lin et al. | 257/347 |
| 2010/0044783 A1 | | 2/2010 | Chuang et al. | |
| 2010/0314687 A1 | * | 12/2010 | Xu | 257/369 |
| 2011/0189847 A1 | * | 8/2011 | Tsai et al. | 438/595 |

FOREIGN PATENT DOCUMENTS

| | | |
|---|---|---|
| JP | 2005019892 A | 1/2005 |
| JP | 2007134432 A | 5/2007 |

\* cited by examiner

*Primary Examiner* — Allen Parker
(74) *Attorney, Agent, or Firm* — Harness, Dickey & Pierce, P.L.C.

(57) ABSTRACT

Example embodiments relate to a method for manufacturing a semiconductor device, wherein a metal gate electrode therein may be formed without a void in a lower portion of the metal gate electrode. The method may include providing a substrate, forming a dummy gate electrode on the substrate, forming a gate spacer on the substrate to be contiguous to the dummy gate electrode, forming a first recess by simultaneously removing a portion of the dummy gate electrode and a portion of the gate spacer, the first recess having an upper end wider than a lower end, forming a second recess by removing the dummy gate electrode remaining after forming the first recess, and forming a metal gate electrode by depositing a metal to fill the first and second recesses.

15 Claims, 14 Drawing Sheets

METHOD FOR MANUFACTURING SEMICONDUCTOR DEVICE HAVING A METAL GATE ELECTRODE

CROSS-REFERENCE TO RELATED APPLICATION

This application claims priority under 35 U.S.C. §119 to Korean Patent Application No. 10-2010-0099393, filed on Oct. 12, 2010 in the Korean Intellectual Property Office, the content of which is herein incorporated by reference in its entirety.

BACKGROUND

1. Field

Example embodiments relate to a method for manufacturing a semiconductor device, and more particularly to a method for manufacturing a semiconductor device having a metal gate electrode.

2. Description of the Related Art

In recent years, instead of silicon oxide, a higher dielectric constant (higher-k) dielectric has been used as a gate insulation film in a MOS field effect transistor, thereby reducing the gate leakage current. However, a higher-k dielectric may not be compatible with the polysilicon used for a gate electrode.

SUMMARY

Some example embodiments relate to a method for manufacturing a semiconductor device, wherein the method may prevent openings from clogging during deposition of a metallic material to form a metal gate electrode.

Some example embodiments relate to a method for manufacturing a semiconductor device, wherein voids may be prevented from being formed during deposition of a metallic material to form the metal gate electrode.

The above and other objects will be described in or be apparent from the following description.

According to an example embodiment, a method for manufacturing a semiconductor device may include providing a substrate, forming a dummy gate electrode on the substrate, forming a gate spacer on the substrate to be contiguous to the dummy gate electrode, forming a first recess by simultaneously removing a portion of the dummy gate electrode and a portion of the gate spacer, the first recess having an upper end wider than a lower end, forming a second recess by removing the dummy gate electrode remaining after forming the first recess, and forming a metal gate electrode by depositing a metal to fill the first and second recesses.

According to another example embodiment, a method for manufacturing a semiconductor device may include providing a substrate; forming a dummy gate electrode on the substrate, forming a gate spacer on the substrate to be contiguous to the dummy gate electrode; forming a recess by removing the dummy gate electrode; removing sidewalls of the gate spacer to make a width of the recess gradually increasing from the bottom to the top portion; and forming a metal gate electrode by depositing a metal to fill the recess.

A method for manufacturing a semiconductor device may also include forming a dummy gate electrode and a gate spacer on a substrate, the dummy gate electrode being between the gate spacer; removing the dummy gate electrode; and forming a metal gate electrode in a space formerly occupied by the dummy gate electrode between the gate spacer, the metal gate electrode having a width that flares outward with increased distance from the substrate.

BRIEF DESCRIPTION OF THE DRAWINGS

The above and other features and advantages will become more apparent when the following detailed description is read with reference to the attached drawings in which.

DETAILED DESCRIPTION

Figure 1:
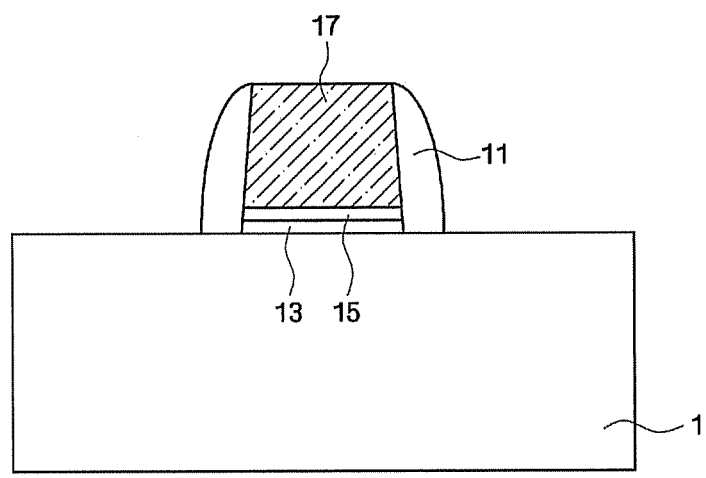
FIGS. 1 to 8 are cross sectional views showing intermediate structures for explaining a method for manufacturing a semiconductor device according to an example embodiment.

Advantages and features of the above and methods of accomplishing the same may be understood more readily by referring to the following detailed description and the accompanying drawings. The examples herein may, however, be embodied in many different forms and should not be construed as being limited to the example embodiments set forth herein. Rather, the example embodiments herein have merely been provided so that the disclosure will be more thorough and complete to ensure full conveyance of the concepts to those skilled in the art. It should also be understood that the scope is to be defined only by the appended claims. In the drawings, the thickness of various layers and/or regions may have been exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1 to 8 are cross sectional views showing intermediate structures for explaining a method for manufacturing a semiconductor device according to an example embodiment. For brevity of explanation, source/drain regions formed in a substrate, and an isolation region such as an STI (shallow trench isolation) region are not illustrated. In addition, it is obvious to one skilled in the art that the teachings herein can be applied to the manufacture of a PMOS or NMOS semiconductor device.

Referring to FIG. 1, a gate insulation film pattern 13, a barrier film pattern 15, a gate spacer 11, and a dummy gate electrode 17 are formed on a substrate 1.

In detail, the substrate 1 may be a bulk silicon or SOI (silicon-on-insulator). Alternatively, the substrate 1 may be a silicon substrate or a substrate of another material, for example, germanium, indium antimonide, lead telluride, indium arsenic, indium phosphide, gallium arsenic, gallium antimonide, but is not limited thereto.

A gate insulation film, barrier film and a dummy gate electrode layer may be sequentially formed on the substrate 1 and patterned, thereby forming a stack having a gate insulation film pattern 13, a barrier film pattern 15 and a dummy gate electrode 17 sequentially stacked, and forming the gate spacer 11 at sidewalls of the stack.

Here, the gate insulation film pattern 13 may be made of, but is not limited to, a high-k dielectric having a dielectric constant higher than silicon oxide. However, the gate insulation film pattern 13 may be made of silicon oxide. The high-k dielectric may be hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. The gate insulation film pattern 13 may be formed by deposition, for example, CVD (Chemical Vapor Deposition), PVD (Physical Vapor Deposition), or ALD (Atomic Layer Deposition).

The barrier film pattern 15 may be made of a metallic material that will not react with overlying materials and that can withstand a relatively high temperature, for example, titanium nitride TiN). The barrier film pattern 15 may be formed by sputtering or ALD.

The dummy gate electrode 17 may be made of polysilicon by CVD, but is not limited thereto.

The gate spacer 11 may be formed by depositing an insulation material forming the gate spacer 11 on the stack having the gate insulation film pattern 13, the barrier film pattern 15 and the dummy gate electrode 17 sequentially stacked and on the entire surface of the substrate 1 and etching the insulation material. The gate spacer 11 may be made of silicon nitride.

Figure 2:
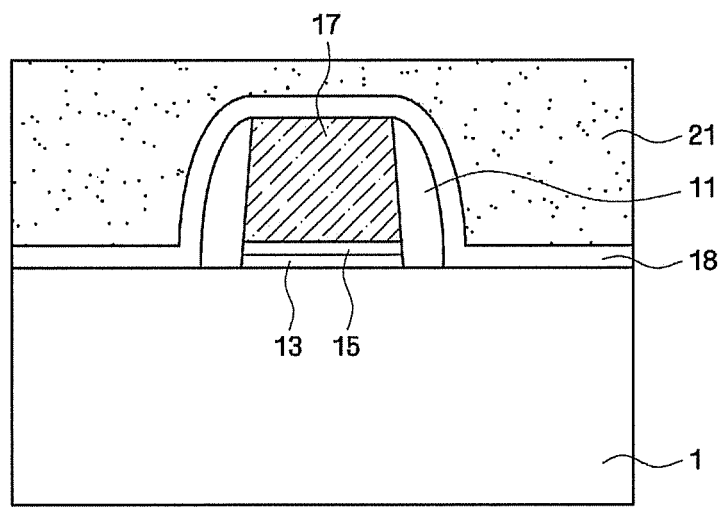

Referring to FIG. 2, an etch stopper film 18 is formed on the entire surface of the resultant product formed by the process shown in FIG. 1, and an insulation layer 21 is then formed on the etch stopper film 18.

The etch stopper film 18 may be made of the same material as the gate spacer 11, for example, silicon nitride, by, for example, CVD.

The insulation layer 21 may be made of a different insulation material from the etch stopper film 18, for example, silicon oxide, by deposition, for example, high density plasma deposition.

Figure 3:
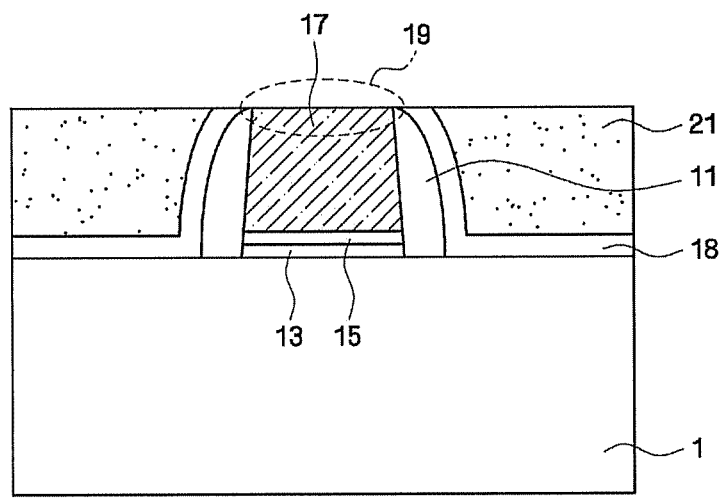

Next, referring to FIG. 3, the insulation layer 21 is planarized to expose a top surface of the dummy gate electrode 17, by, for example CMP (Chemical Mechanical Polishing).

Figure 4:
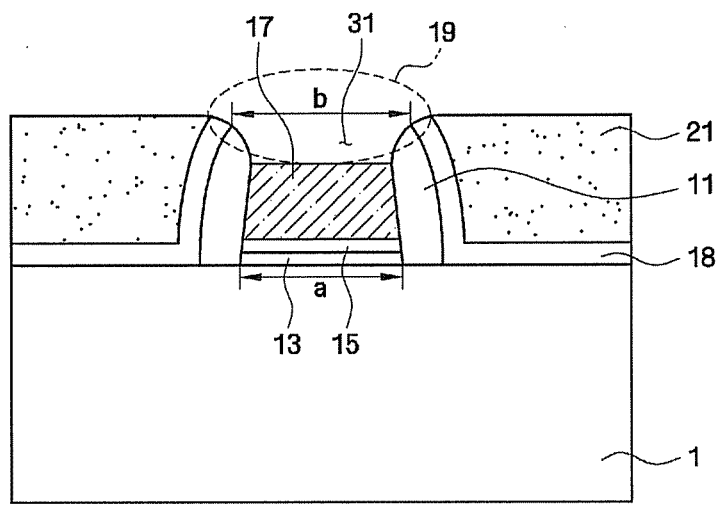

Referring to FIG. 4, the dummy gate electrode 17 and the gate spacer 11 are simultaneously etched by plasma-based dry etching. Not only the dummy gate electrode 17 but also the gate spacer 11 are removed, thereby increasing a width of an opening region 19.

In detail, the plasma-based dry etching is performed, thereby simultaneously removing a top surface of the dummy gate electrode 17 and a portion of the gate spacer 11 using a single process, thereby forming a first recess 31. For example, the gate spacer 11 may be etched such that a width of a top portion of the first recess 31 is greater than that of a bottom portion thereof. The opening region 19 may further be widened by an etched region of the gate spacer 11. For example, the increased width of the opening region 19 may be greater than a critical dimension (CD) of the dummy gate electrode 17.

An overhang existing in the opening region 19 may be removed during etching of the gate spacer 11. If the overhang is removed, it is possible to prevent the opening region 19 from clogging by a metal layer 41 in the course of filling the inside of the recesses 31 and 33 during deposition of the metal layer 41 for forming the metal gate electrode 43. Therefore, the recesses 31 and 33 can be filled with the metal layer 41 without the metal layer 41 clogging due to an overhang, thereby preventing voids from being generated.

The plasma-based dry etching refers to generating plasma by ionizing a source gas and etching a target as desired by allowing the generated plasma to collide with the target. For example, a combination gas of $NF_3$, HBr, and $Cl_2$ may be used as the source gas. When the combination gas of $NF_3$, HBr, and $Cl_2$ is used as the source gas, a portion of the dummy gate electrode 17 made of polysilicon and a portion of the gate spacer 11 made of silicon oxide may be simultaneously etched. However, the source gas is not limited to the combination gas of $NF_3$, HBr, and $Cl_2$.

A width of the opening region 19 and a slope of a profile of the gate spacer 11 may be adjusted by adjusting a composition ratio of the source gas including $NF_3$, HBr, and $Cl_2$. For example, assuming that etching is performed for the same duration of time, the higher the proportion of $NF_3$ contained in the overall source gas, the greater the extent of the etching, thereby further increasing the width of the opening region 19. In addition, the greater the width of the opening region 19, the gentler the slope of the profile of the top portion of the gate spacer 11.

In an experimental example, when plasma-based dry etching was performed using a source gas comprising 200 HBr, 20 $Cl_2$, and 5 $NF_3$ for 10", a width (a) of a lower region between the gate spacers 11 was 22 nm, and a width (b) of the opening region 19 was 24 nm. In addition, when plasma-based dry etching was performed using a source gas comprising 200 HBr, 20 $Cl_2$, and 20 $NF_3$ for 10", a width (a) of a lower region between the gate spacers 11 was 22 nm, and a width (b) of the opening region 19 was 29 nm. As described above, when the proportion of $NF_3$ relative to the overall source gas is increased, the width of the opening region 19 can further be increased even when the etching is performed for the same duration of time.

In addition, the width of the opening region 19 and the slope of a profile of the top portion of the gate spacer 11 can be adjusted by adjusting the duration of time in which the plasma-based dry etching is performed. That is to say, assuming that other conditions are the same, except for an etching time, as the gate spacer 11 is continuously etched over time, the width (b) of the opening region 19 gradually increases and the slope of the profile of the upper portion of the gate spacer 11 becomes much gentler.

Since the top surface of the dummy gate electrode 17 and portion of the gate spacer 11 are simultaneously removed using a single process, an increased depth of the opening region 19 that is widened as the result of etching the gate spacer 11 can be adjusted by adjusting a removing depth of the dummy gate electrode 17. For example, the deeper the dummy gate electrode 17 is removed by plasma-based dry etching, the deeper the increased depth of the opening region 19 is widened as the result of etching the gate spacer 11 because a deeper-positioned portion of the gate spacer 11 is also etched.

However, parameters which can adjust the width of the opening region 19 are not limited to those listed herein and may include adjusting the power applied to a plasma generator, characteristics of the plasma, and so on.

Figure 14:
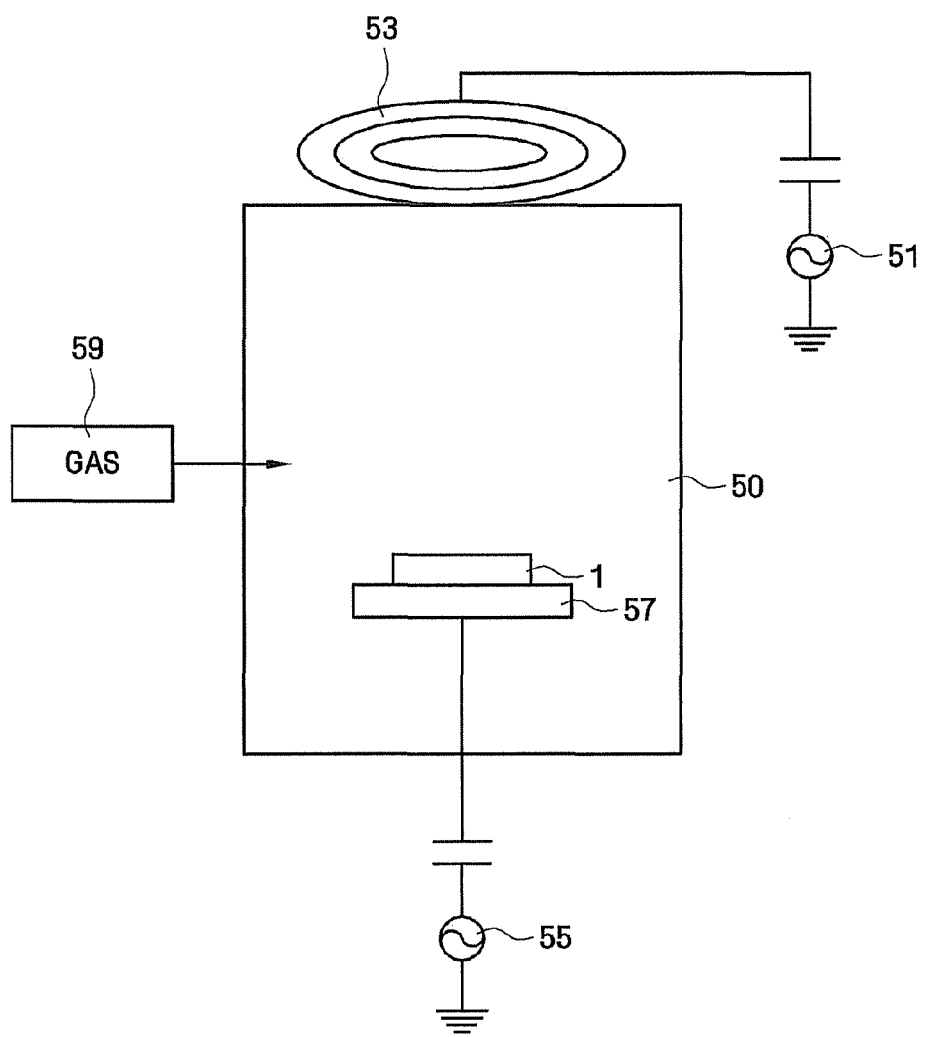
FIG. 14 is a cross sectional view schematically showing an induced plasma generator according to an example embodiment.

As shown in FIG. 14, charging damage and physical damage due to plasma-based etching can be prevented, thereby maintaining the reliability of the semiconductor device.

FIG. 14 shows an inductively coupled plasma (ICP) generator according to an example embodiment. A chamber 50 insulates the substrate 1, and a source gas to be fed to the chamber 50 may be supplied by a gas supply means 59. A substrate holder 57 capable of supporting the substrate 1 is placed inside the chamber 50, and the substrate holder 57 is connected to a lower RF power 55 to induce a bias voltage to the substrate 1 to be etched. An induction coil 53 allows RF power to be effectively transferred and may be connected to an upper RF power 51. The plasma-based etching taking place inside the chamber 50 depends on a RF self-bias voltage induced to the substrate 1. Therefore, the charging damage and physical damage can be prevented from being generated by reducing the self bias voltage. In order to reduce the self-bias voltage, a relatively high source power of, for example, 800 W or greater, may be applied to the upper RF power 51, or the lower RF power 55 may be maintained at a level of bias power of substantially zero.

Figure 5:
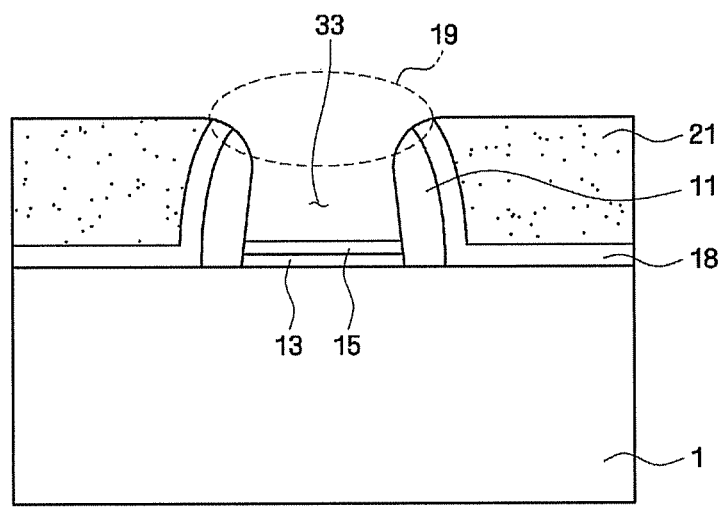

Referring to FIG. 5, the remaining dummy gate electrode 17 may be removed.

Since only a portion of the dummy gate electrode 17 remaining in the process shown in FIG. 4 is removed, the remaining dummy gate electrode 17 may be removed by the process shown in FIG. 5. The second recess 33 can be formed by removing the remaining dummy gate electrode 17. Lateral profiles of the first recess 31 and the second recess 33 may be interconnected. For example, a wet etching process may be used to remove the remaining dummy gate electrode 17. In detail, during the wet etching process, the remaining dummy gate electrode 17 may be removed by exposing the remaining dummy gate electrode 17 in an aqueous solution including a hydroxide source to a sufficiently high temperature for a sufficient time. The hydroxide source may include, but is not limited to, ammonium hydroxide and tetraalkyl ammonium hydroxide. In addition, the process for removing the remaining dummy gate electrode 17 is not limited to the wet etching process, but a dry etching process may also be used to remove the remaining dummy gate electrode 17.

In a case where the wet etching process based on $NH_4OH$ is performed, since $NH_4OH$ has a higher etching selectivity to the dummy gate electrode 17 than to the barrier film pattern 15, the dummy gate electrode 17 made of, for example, polysilicon, may be etched in a state in which the barrier film pattern 15 made of, for example, TiN, is not etched. Therefore, since the remaining dummy gate electrode 17 is completely removed while the barrier film pattern 15 is not practically etched, the gate insulation film pattern 13 disposed under the barrier film pattern 15 can be prevented from being damaged. When the gate insulation film pattern 13 is partially damaged, a breakdown voltage may be affected, thereby degrading the reliability of a semiconductor device. For example, gate leakage current may be generated. Accordingly, the wet etching process is performed using a material demonstrating a higher etching selectivity to the dummy gate electrode 17 than to the barrier film pattern 15, thereby preventing the gate insulation film pattern 13 from being damaged and ultimately maintaining the reliability of a semiconductor device.

Figure 6:
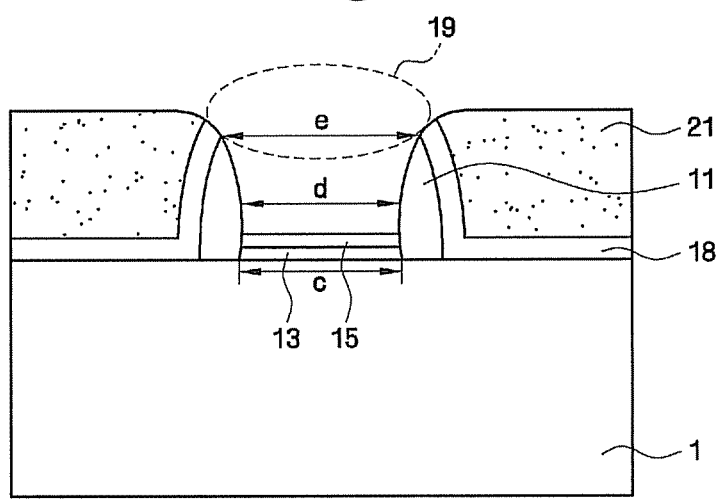

Referring to FIG. 6, sidewalls of the gate spacer 11 are etched, so that the gate spacer 11 may have a positive profile. In addition, as the result of the etching process, the width of the opening region 19 may further be increased.

The sidewalls of the gate spacer 11 in the semiconductor device resulting after the process shown in FIG. 5 may have a negative profile. The negative profile may mean a profile of the gate spacer 11 configured to have a width tapering upwardly. In a case where the gate spacers 11 have a negative profile, void defects may be generated at a lower region of the second recess 33 when a metal layer is deposited in the recesses 31 and 33 in a subsequent process for forming a metal gate electrode, which will later be described. For example, voids may be generated at lower edges of the second recess 33.

In detail, the gate spacer 11 may be etched so as to allow the gate spacer 11 to have a positive profile using, for example, plasma-based dry etching. For example, in order to create a positive profile, the etching process may be gradually performed from a lower portion to an upper portion of the gate spacer 11. Through the etching process, thicknesses of the gate spacer 11 may gradually decrease from the lower portion to the upper portion of the gate spacer 11. Therefore, when the gate spacer 11 has a positive profile, the width of the second recess 33 may gradually increase from a lower portion to an upper portion of the first recess 31. Since the sidewalls of the gate spacer 11 having a positive profile and a bottom surface of the second recess 33 contact each other, while forming an obtuse angle, at the lower portion of the gate spacer 11, depositing a metal on the lower portion of the second recess 33 is easily performed. Therefore, it is possible to prevent voids from being generated at the lower portion of the second recess 33 when the metal is deposited for forming a metal gate electrode.

However, since the etching process is performed in a state in which the dummy gate electrode 17 is removed and the barrier film pattern 15 is exposed, a source gas having a higher etching selectivity, for example, 10:1 or higher, to the gate spacer 11 than to the barrier film pattern 15 may be used in the plasma-based dry etching process. In the process shown in FIG. 6, unlike in the process shown in FIG. 4, a source gas without $Cl_2$ may be used. For example, a combination gas of $NF_3$ and HBr may be used as the source gas. In a case where a source gas including $Cl_2$ is used, the barrier film pattern 15 made of, for example, TiN, may be etched and damaged by Cl$_2$. Accordingly, the gate spacer 11 may be etched using the source gas without Cl$_2$ to avoid causing damages to the barrier film pattern 15. Therefore, it is possible to prevent the gate insulation film pattern 13 from being damaged by the barrier film pattern 15, thereby maintaining the reliability of a semiconductor device.

In a case of using the combination gas of NF$_3$ and HBr as a source gas, the width of the opening region 19 of the gate spacer 11 and a slope of the profile of the gate spacer 11 can be adjusted by adjusting a composition ratio of NF$_3$ and HBr. For example, the more the proportion of NF$_3$ based on to the total amount of the source gas, the greater the extent of the etching for the same period of time, so that the width of the opening region 19 of the gate spacer 11 is further increased and the profile of the gate spacer 11 has a more positive slope. The more positive slope the profile of the gate spacer 11 has, the greater the change in the thickness of the gate spacer 11 is from the bottom portion to the top portion, or the greater the change in the width of the gate spacer 11 is from the bottom portion of the second recess 33 to the top portion of the first recess 31.

In addition, the width of the opening region 19 of the gate spacer 11 and a slope of the profile of the gate spacer 11 can be adjusted by adjusting a time of the plasma-based dry etching process. In an experimental example, after a plasma-based dry etching process is performed for 20" using a source gas including 200 HBr and 10 NF$_3$, widths of portions between gate spacers 11 and a width of the opening region 19 were measured. As the measurement result, the width (c) of the lower region between gate spacers was 30 nm, the width (d) of a middle region between gate spacers was 32 nm, and the width (e) of the opening region 19 was 43.78 nm. After a plasma-based dry etching process is performed for 40" using a source gas including 200 HBr and 10 NF$_3$, widths of portions between gate spacers 11 and a width of the opening region 19 were measured. As the measurement result, the width (c) of the lower region between gate spacers was 29.85 nm, the width (d) of a middle region between gate spacers was 35.32 nm, and the width (e) of the opening region 19 was 46.77 nm. As described above, the width of the opening region 19 can be further increased and the profile of the gate spacer 11 can have a more positive slope by extending an etching time.

Figure 7:
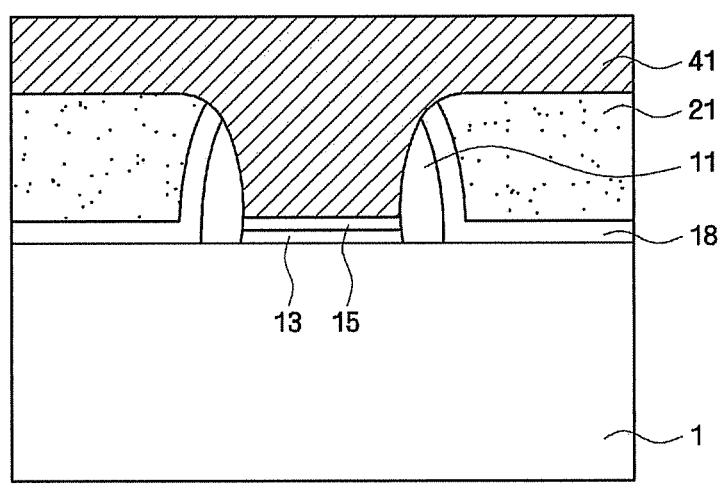

Referring to FIG. 7, a metal layer 41 is formed to a thickness that is enough to sufficiently fill the first recess 31 and the second recess 33 formed after the process shown in FIG. 6.

The metal layer 41 is used to form a gate electrode, and may be formed of a single layer or multiple layers made of, for example, hafnium, zirconium, titanium, tantalum, aluminum, or alloys thereof. The metal layer 41 may be a single layer made of an aluminum-titanium alloy, but is not limited thereto. The metal layer 41 may be formed by deposition, for example, CVD, PVD, ALD or sputtering.

In the deposition process of the metal layer shown in FIG. 7, openings can be prevented from clogging by the opening region 19 having an increased width, and voids can be prevented from being generated at a lower edge of the second recess 33 by the gate spacer 11 having a positive profile, thereby allowing easier depositing of the metal layer 41.

Figure 8:
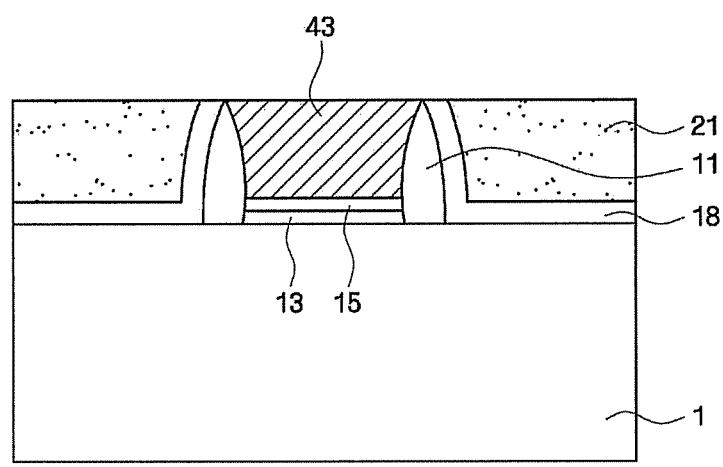

Referring to FIG. 8, the metal layer 41 is polished until the polishing is stopped at the gate spacer 11. After the process shown in FIG. 8, the metal layer 41 may remain at a region between the gate spacers 11, thereby forming a metal gate electrode 43.

Figure 9:
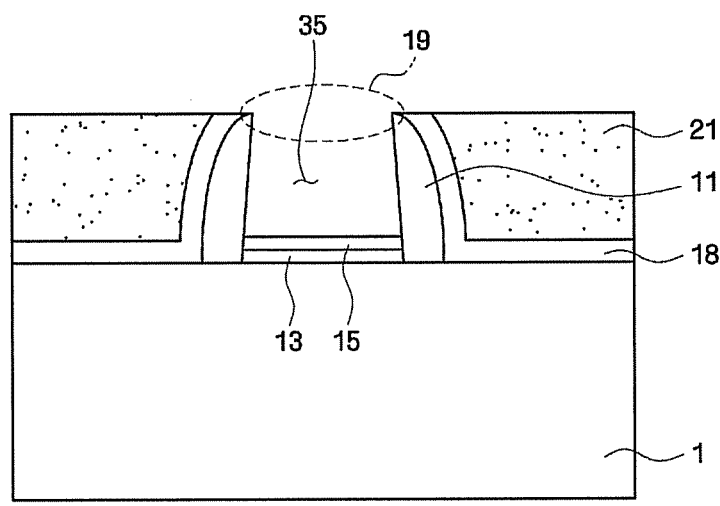
FIGS. 9 to 11 are cross sectional views showing intermediate structures for explaining another method for manufacturing a semiconductor device according to an example embodiment.
Figure 10:
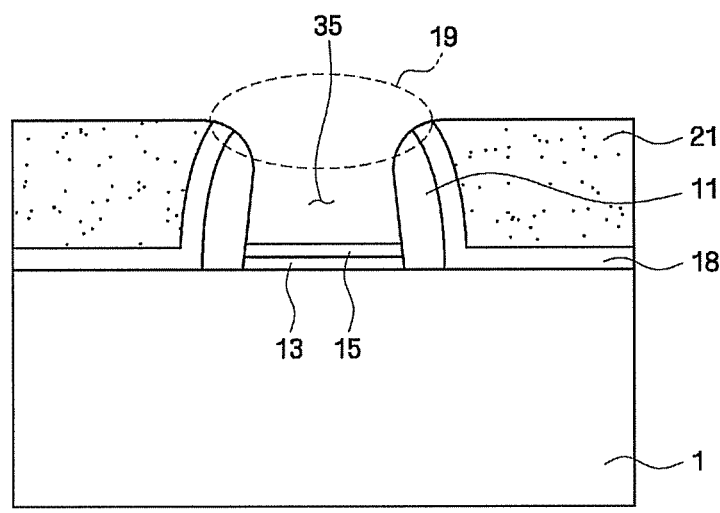
Figure 11:
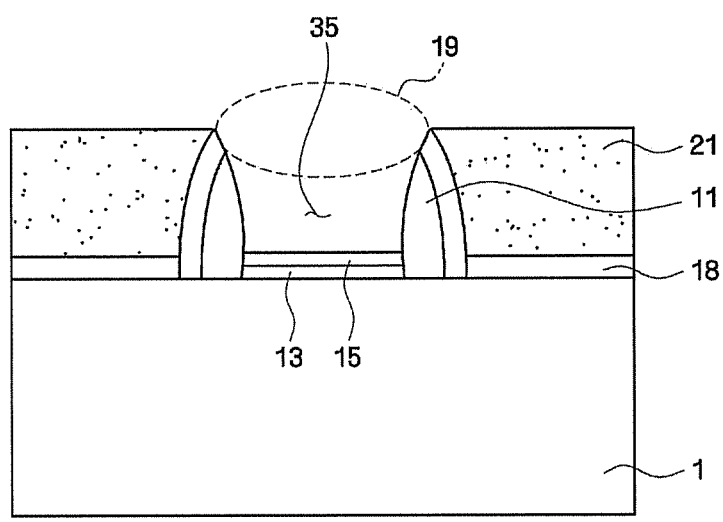

FIGS. 9 to 11 are cross sectional views showing intermediate structures for explaining another method for manufacturing a semiconductor device according to an example embodiment. For brevity of explanation, the following description will focus on differences between the methods for manufacturing a semiconductor device according to FIGS. 9 to 11 and previously-discussed FIGS. 1 to 8.

The method for manufacturing a semiconductor device according to FIGS. 9 to 11 is different from that according to FIGS. 1 to 8 in that a third recess 35 is formed by removing a dummy gate electrode 17 through a single process.

Using the method shown in FIGS. 1 to 3, a gate insulation film pattern 13, a barrier film pattern 15, a gate spacer 11, a dummy gate electrode 17, an etch stopper film 18, and an insulation layer 21 are formed on a substrate 1, and the insulation layer 21 is planarized to expose a top surface of the dummy gate electrode 17.

Next, referring to FIG. 9, the dummy gate electrode 17 is removed using a dry etching process or a wet etching process, thereby forming a third recess 35.

Referring to FIG. 10, a top portion of the gate spacer 11 is removed to increase a width of an opening region 19. The increased width of the opening region 19 may be greater than a critical dimension (CD) of the dummy gate electrode 17.

Referring to FIG. 11, the gate spacer 11 is formed to have a positive profile and the width of the opening region 19 is increased by etching sidewalls of the gate spacer 11. The etching process may be gradually performed from a lower portion to an upper portion of the gate spacer 11. Through the etching process, thicknesses of the gate spacer 11 may gradually decrease from the lower portion to the upper portion of the gate spacer 11. Thus, the width of the third recess 35 may also gradually increase from its lower portion to its upper portion. The process shown in FIG. 11 may be performed subsequent to the process shown in FIG. 9 or 10.

In detail, since the process shown in FIG. 11 is performed in a state in which the dummy gate electrode 17 is removed and the barrier film pattern 15 is exposed in the process shown in FIG. 10 or 11, a source gas having a higher etching selectivity, for example, 10:1 or higher, to the gate spacer 11 than to the barrier film pattern 15 may be used in the plasma-based dry etching process. For example, a combination gas of NF$_3$ and HBr may be used as the source gas. A width of the opening region 19 and a slope of the profile of the gate spacer 11 can be adjusted by adjusting a composition ratio of NF$_3$ and HBr, and a relatively high source power of, for example, 800 W or higher, may be applied to an upper RF power 51 (FIG. 14) in order to reduce a self bias voltage, while a lower RF power 55 (FIG. 14) may be maintained at a bias power of approximately zero. That is to say, it should be understood by one skilled in the art that substantially the same process conditions discussed in connection with FIGS. 1-8 may also applied to FIGS. 9-11.

Using the method shown in FIGS. 7 and 8, a metal layer may be formed to a thickness that is enough to sufficiently fill the third recess 35 and then polished until the gate spacer 11 is reached, thereby forming a metal gate electrode in the third recess 35.

Figure 12:
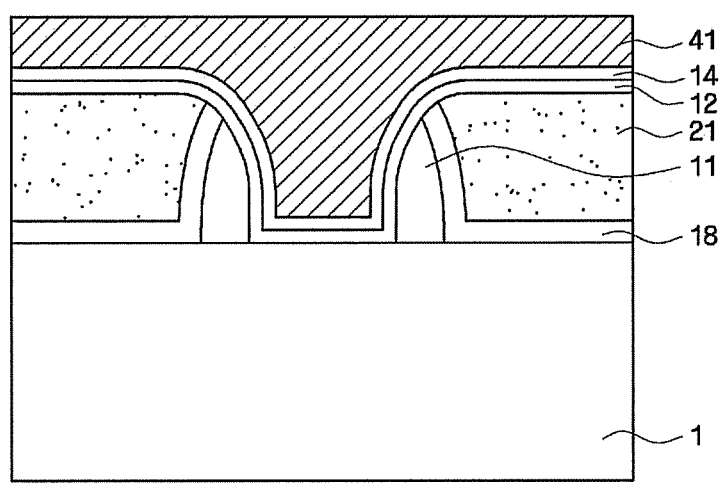
FIGS. 12 and 13 are cross sectional views showing intermediate structures for explaining another method for manufacturing a semiconductor device according to an example embodiment.
Figure 13:
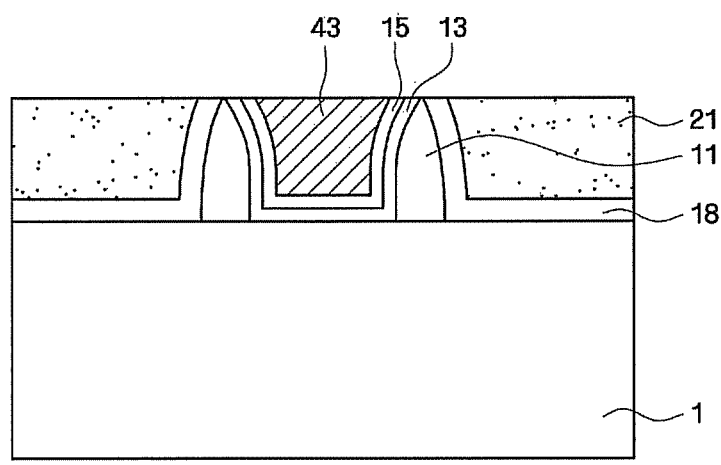

FIGS. 12 and 13 are cross sectional views showing intermediate structures for explaining another method for manufacturing a semiconductor device according to an example embodiment. For brevity of explanation, the following description will focus on differences between the methods for manufacturing a semiconductor device according to FIGS. 12 to 13 and previously-discussed FIGS. 1 to 8. The method for manufacturing a semiconductor device according to FIGS. 12 to 13 is different from that according to FIGS. 1 to 8 in that a gate insulation film pattern 13 and a barrier film pattern 15 are conformally formed after removing a dummy gate electrode 17. The gate insulation film pattern 13 and the barrier film pattern 15 are formed at not only a bottom portion of a metal gate electrode 43 but also on lateral surfaces of the metal gate electrode 43.

Using the method shown in FIGS. 1 to 6, a gate spacer 11, a dummy gate electrode 17, an etch stopper film 18, and an insulation layer 21 are formed on a substrate 1, and a gate insulation film pattern 13 and a barrier film pattern 15 are etched to form a first recess 31 and a second recess 33. In addition, a width of the opening region 19 can be increased by etching the first recess 31, and the gate spacer 11 is formed to have a positive profile and the width of the opening region 19 can be further increased by etching sidewalls of the gate spacer 11 after forming the second recess 33.

Referring to FIG. 12, a gate insulation film 12 may be formed on a top surface of the insulation layer 21, lateral surfaces of the gate spacer 11 and a bottom surface of the third recess 35. Next, a barrier film 14 may be conformally formed on the gate insulation film 12.

Next, a metal layer 41 may be deposited to a thickness that is enough to sufficiently fill the first recess 31 and the second recess 33. A width of the opening region 19 is increased to be greater than a critical dimension (CD) of the dummy gate electrode 17, and the gate insulation film 12 formed on the lateral surfaces of the gate spacer 11 having a positive profile and the barrier film 14 conformally formed on the gate insulation film 12 also have a positive profile. Therefore, the metal layer 41 can be deposited without clogging of the opening region 19 and without the generation of voids.

Next, referring to FIG. 13, the metal layer 41 is polished until the polishing is stopped at the gate spacer 11. As a result, a gate insulation film pattern 13 and a barrier film pattern 15 are formed and the metal layer 41 remains at a region between gate spacers 11, thereby forming a metal gate electrode 43.

While the teachings has been particularly shown and described with reference to various example embodiments herein, it will be understood by those of ordinary skill in the art that various changes in form and details may be made therein without departing from the spirit and scope of the disclosure as defined by the following claims. It is therefore desired that the example embodiments be considered in all respects as merely illustrative and not restrictive, with reference being made to the appended claims rather than the foregoing description to indicate the scope of the disclosure.

What is claimed is:

1. A method for manufacturing a semiconductor device, the method comprising:
   forming a barrier film pattern and a dummy gate electrode on a substrate;
   forming a gate spacer on a sidewall of the dummy gate electrode;
   forming a first recess
      by simultaneously removing
         a portion of the dummy gate electrode and
         a portion of the gate spacer,
   the first recess having an upper end wider than a lower end;
   forming a second recess by removing the dummy gate electrode remaining after forming the first recess; and
   etching the gate spacer after forming the second recess so that widths of the first and second recesses gradually increase from a lower portion of the second recess to an upper portion of the first recess; and
   forming a metal gate electrode by depositing a metal on the barrier film pattern to fill the first and second recesses.

2. The method of claim 1, wherein the forming a first recess includes plasma-based dry etching.

3. The method of claim 2, wherein the plasma-based dry etching is performed in a plasma chamber in which a bias voltage applied to the substrate is substantially zero.

4. The method of claim 2, wherein the plasma-based dry etching is performed using a combination gas of HBr, $NF_3$, and $Cl_2$.

5. The method of claim 1, wherein the forming a second recess includes $NH_4OH$-based wet etching.

6. The method of claim 1, wherein the etching the gate spacer is performed by plasma-based dry etching using a source gas having a higher etch selectivity to the gate spacer than to the barrier film pattern.

7. The method of claim 6, wherein the plasma-based dry etching is performed in a plasma chamber in which a bias voltage applied to the substrate is substantially zero.

8. The method of claim 6, wherein the plasma-based dry etching is performed using a combination of HBr, $NF_3$, and $Cl_2$ as a source gas.

9. The method of claim 8, wherein a slope of the gate spacer is adjusted by adjusting a composition ratio of $NF_3$ and HBr.

10. The method of claim 6, wherein a slope of the gate spacer is adjusted by adjusting a duration of time in which the plasma-based dry etching is performed.

11. The method of claim 10, wherein the barrier film pattern includes titanium nitride.

12. The method of claim 1, further comprising:
   forming a gate insulation film pattern made of a high dielectric constant (high-k) material on the substrate, wherein the barrier film pattern is formed on the gate insulation film pattern.

13. The method of claim 1, wherein the forming a barrier film pattern includes the barrier film pattern being formed before the dummy gate electrode.

14. The method of claim 1, wherein the forming a second recess includes etching the dummy gate electrode while retaining an integrity of the barrier film pattern.

15. The method of claim 1, further comprising:
   forming a gate insulation film pattern on the substrate, the gate insulation film pattern being formed before the barrier film pattern.

* * * * *